(12) United States Patent
Venugopal et al.

(10) Patent No.: US 10,547,311 B2
(45) Date of Patent: Jan. 28, 2020

(54) REDUCING GLITCHES THAT OCCUR WHEN MULTIPLEXING OF ASYNCHRONOUS CLOCKS USING FLIP-FLOPS AND LOGIC GATES

(71) Applicant: TEXAS INSTRUMENTS INCORPORATED, Dallas, TX (US)

(72) Inventors: Sunil Kashyap Venugopal, Irving, TX (US); Karl John Wallinger, Dallas, TX (US); George Vincent Konnail, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/980,486

(22) Filed: May 15, 2018

(65) Prior Publication Data

US 2019/0356313 A1    Nov. 21, 2019

(51) Int. Cl.
*H03K 3/037*   (2006.01)
*H03K 19/003*  (2006.01)
*G06F 1/10*    (2006.01)

(52) U.S. Cl.
CPC ............. *H03K 19/003* (2013.01); *G06F 1/10* (2013.01); *H03K 3/0375* (2013.01)

(58) Field of Classification Search
CPC ....... H03K 19/003; H03K 3/0375; G06F 1/10
USPC ........................................................ 327/225
See application file for complete search history.

(56) References Cited

U.S. PATENT DOCUMENTS

| | | | | |
|---|---|---|---|---|
| 5,811,995 A * | 9/1998 | Roy | ...................... | H04L 7/0083 327/298 |
| 6,600,345 B1 * | 7/2003 | Boutaud | ................... | G06F 1/08 327/294 |
| 6,784,699 B2 * | 8/2004 | Haroun | ...................... | G06F 1/08 327/407 |
| 7,046,047 B2 * | 5/2006 | Daijo | ........................ | G06F 1/08 327/298 |
| 7,629,828 B1 * | 12/2009 | Nekl | ......................... | G06F 1/08 327/291 |
| 8,350,600 B2 * | 1/2013 | Leon | ................... | G01R 31/2884 327/298 |
| 8,415,981 B2 * | 4/2013 | Ivory | ..................... | H03K 5/135 326/93 |
| 8,975,921 B1 * | 3/2015 | Sangolli | ............... | H03K 19/003 326/46 |

* cited by examiner

*Primary Examiner* — Ryan Jager
(74) *Attorney, Agent, or Firm* — Ebby Abraham; Charles A. Brill; Frank D. Cimino

(57) ABSTRACT

In one embodiment, a method includes receiving an output of a first combinational logic at an enable terminal of a first flip-flop. The first combinational logic inputs include a disable first clock signal from a clock switchover circuit and a disable second clock signal from the clock switchover circuit. A set terminal of the first flip-flop receives an output of a logic gate, and the logic gate receives a select signal and a first clock signal. An input terminal of the first flip-flop receives, an output of a second flip-flop. A reset terminal of the first flip-flop receives an output of a second combinational logic. The second combinational logic inputs include a first clock stopped signal, a power-on-reset signal, and the select signal, the first clock stopped signal indicating a stop in the first clock signal. An output terminal of the first flip-flop outputs a modified select signal.

16 Claims, 8 Drawing Sheets

REDUCING GLITCHES THAT OCCUR WHEN MULTIPLEXING OF ASYNCHRONOUS CLOCKS USING FLIP-FLOPS AND LOGIC GATES

TECHNICAL FIELD

This disclosure generally relates to clock multiplexing, and more particularly to a clock multiplexing circuit involving asynchronous clocks.

BACKGROUND

Asynchronous clocks are increasingly utilized in technology. For example, many circuits consist of different functional modules that operate at different clock frequencies. It is often necessary to switch the source of a clock line while a circuit is running. Conventionally, the system multiplexes the two different frequency clocks, and controls the multiplexer to select one of the clocks as the clock line.

However, a chance of generating a clock glitch occurs during or soon after a switch between the asynchronous clocks. A glitch on the clock line may be hazardous to the whole system as it may cause metastability in the system.

SUMMARY OF PARTICULAR EMBODIMENTS

In one embodiment, a method includes receiving an output of a first combinational logic at an enable terminal of a first flip-flop. The first combinational logic inputs include a disable first clock signal from a clock switchover circuit and a disable second clock signal from the clock switchover circuit. A set terminal of the first flip-flop receives an output of a logic gate, and the logic gate receives a select signal and a first clock signal. An input terminal of the first flip-flop receives, an output of a second flip-flop. A reset terminal of the first flip-flop receives an output of a second combinational logic. The second combinational logic inputs include a first clock stopped signal, a power-on-reset signal, and the select signal, the first clock stopped signal indicating a stop in the first clock signal. An output terminal of the first flip-flop outputs a modified select signal.

DESCRIPTION OF EXAMPLE EMBODIMENTS

Figure 1:
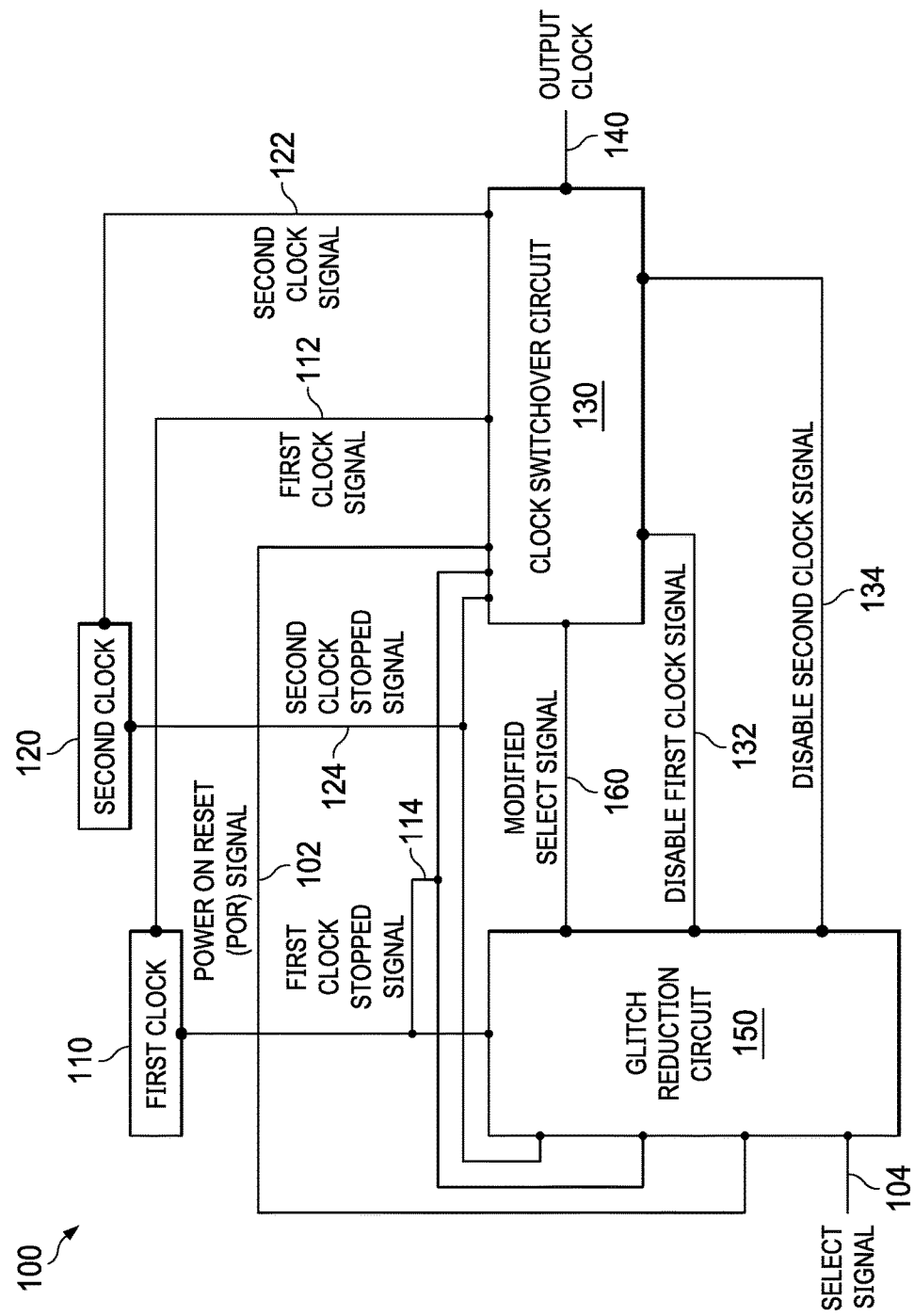
FIG. 1 illustrates system architecture that reduces glitches on an output clock when transferring clock signals between a first clock and a second clock.

This disclosure describes one or more glitch reduction circuits that may reduce one or more glitches introduced when switching between two asynchronous clocks. In one embodiment, a method includes receiving an output of a first combinational logic at an enable terminal of a first flip-flop. The first combinational logic inputs include a disable first clock signal from a clock switchover circuit and a disable second clock signal from the clock switchover circuit. A set terminal of the first flip-flop receives an output of a logic gate, and the logic gate receives a select signal and a first clock signal. An input terminal of the first flip-flop receives an output of a second flip-flop. A reset terminal of the first flip-flop receives an output of a second combinational logic. The second combinational logic inputs include a first clock stopped signal, a power-on-reset signal, and the select signal, the first clock stopped signal indicating a stop in the first clock signal. An output terminal of the first flip-flop outputs a modified select signal.

Glitches are inadvertent clock pulses that occur when switching between two asynchronous clocks. In certain situations, a glitch may occur as a runt pulse—a clock pulse which is short in duration. These runt pulses may cause a clock width violation as the runt pulses do not exceed the clock-pulse minimum width required for certain modules of the system. In addition, in certain situations, a glitch may occur when the outputted clock signal is at a frequency that is different than the anticipated clock frequency. These glitches tend to cause metastability in the system as the output based on the clock cycle is now unknown.

To reduce the occurrence of glitches, a glitch reduction circuit may be used. The glitch reduction circuit utilizes flip-flops and logic gates to ensure that the transition from one clock to another clock (i.e., a switchover) occurs without faulty outputs. The glitch reduction circuit may work with existing clock switchover circuits to help prevent glitches from the output clock of the clock switchover circuit.

The disclosure may present several technical advantages. Technical advantages of the disclosed glitch reduction circuit may include outputting an error-free select signal that allows clock switchover circuit to output a glitch-free clock signal especially during a switchover between two asynchronous clocks. Another technical advantage of the glitch reduction circuit may include increasing the resiliency of using asynchronous clocks as the glitch reduction circuit may be dependent only on one clock functioning. In addition, another technical advantage of the disclosed glitch reduction circuit is the improved performance of the system as metastability in the system may be reduced. Moreover, the disclosed glitch reduction circuit may improve the robustness of the system as the system may now be immune rapid toggling of clock select signal and switching between multiple clocks (regardless of each clock's respective frequency and/or the frequency of the clock select signal). In addition, another technical advantage may include improvement in redundancy as the disclosed glitch reduction circuit may enable switching between clocks when a previously-chosen clock or a target clock is not functioning properly (e.g., stops functioning).

Other technical advantages of the present disclosure will be readily apparent to one skilled in the art from the following figures, descriptions, and claims. Moreover, while specific advantages have been enumerated above, various embodiments may include all, some, or none of the enumerated advantages.

FIG. 1 illustrates system architecture 100 that reduces glitches on an output clock when transferring clock signals between first clock 110 and second clock 120. In FIG. 1, system architecture 100 includes first clock 110, second clock 120, clock switchover circuit 130, and glitch reduction circuit 150. Clock switchover circuit 130 may communicate output clock 140 as a clocking signal to another device. Glitch reduction circuit 150 may communicate a modified select signal 160 to clock switchover circuit 130 to indicate whether to use a clock signal from first clock 110 or a clock signal from second clock 120.

System architecture 100 also contains signals communicated between the components. System architecture 100 may contain the following signals: power on reset (POR) signal 102, first clock signal 112, first clock stopped signal 114, second clock signal 122, second clock stopped signal 124, disable first clock signal 132, disable second clock signal 134, output clock 140, and modified select signal 160.

First clock 110 may represent any component or circuit that provides a clocking signal in system architecture 100, and second clock 120 may represent any component or circuit that provides a second clocking signal in system architecture 100. In certain embodiments, first clock signal 112 from first clock 110 is asynchronous from second clock signal 122 from second clock 120. Moreover, first clock 110 and/or second clock 120 may become dead or unreliable. When first clock 110 or second clock 120 becomes dead, the respective clock may no longer output a clock signal. In addition, first clock 110 or second clock 120 may become unreliable when a fault occurs in the clock generation or propagation circuits of the system architecture 100. Such faults may cause the entire system to behave unpredictably and/or interfere with the system's designed functionality. In certain embodiments, a clock monitoring circuit may monitor first clock 110 and/or second clock 120 to determine if first clock 110 and/or second clock 120 are toggling with an expected frequency. The select signal 104, first clock stopped signal 114, and/or second clock stopped signal 124 may be used to indicate the outcome of the clock monitoring circuit.

Clock switchover circuit 130 may communicate output clock 140 as a clocking signal to another device. Clock switchover circuit 130 may allow a switch between first clock signal 112 from first clock 110 to second clock signal 122 from second clock 120. Similarly, clock switchover circuit 130 may allow a switch between second clock signal 122 from second clock 120 to first clock signal 112 from first clock 110. Clock switchover circuit 130 helps prevent glitches from being introduced during a switchover between clocks. However, in certain circumstances, clock switchover circuit 130 may inadvertently introduce one or more glitches to output clock 140.

Without glitch reduction circuit 150, clock switchover circuit 130 may inadvertently introduce one or more glitches to output clock 140. To help prevent glitches, glitch reduction circuit 150 may communicate modified select signal 160 to clock switchover circuit 130. The modified select signal 160 transmitted from glitch reduction circuit 150 to clock switchover circuit 130 enables clock switchover circuit 130 to produce a glitch-free output clock and/or a glitch-reduced output clock. In certain embodiments, if the select signal identifying the chosen clock switches rapidly (relative to the frequency of the current clock chosen), clock switchover circuit 130 alone may not be able to avoid glitches on the output clock. In this embodiment, glitch reduction circuit 150 may generate modified select signal 160 such that successive clock-switchover requests by any component are serviced only upon completion of any pending or ongoing clock-switchover operations.

As discussed in further detail in later figures, glitch reduction circuit 150 may comprise combinational logic, switches, and/or flip-flops in order to prevent glitches that may occur based on select signal 104.

POR signal 102 is a signal that represents a system-reset signal when power is applied to system architecture 100. The POR signal, in general, may indicate that a system-wide shutdown is required due to extraneous events, and its generation may depend upon operating conditions specific to the application. When POR signal 102 is enabled, glitch reduction circuit 150 and clock switchover circuit 130 are reset.

Select signal 104 indicates whether output clock 140 should be representative of first clock signal 112 or second clock signal 122. Select signal 104 may be received from a top-level system module, which indicates a command to switch from one clock to the other. This decision may be application specific, and can range from switching from an unreliable clock to a reliable clock in safety-critical applications to switching from a high-frequency clock to a low-frequency clock to reduce power consumption in low-power applications. Select signal 104 may indicate the controlling clock signal between first clock signal 112 and second clock signal 122. For example, select signal 104 may indicate first clock signal 112 is controlling by going LOW. As another example, select signal 104 may indicate second clock signal 122 is controlling by going HIGH. However, output clock 140 communicated by clock switchover circuit 130 may not be a direct replica of the controlling clock signal. For example, clock switchover circuit 130 may incidentally introduce glitches into output clock 140 because of the timing of the switchover. As an example, rapidly toggling select signal 104 between HIGH and LOW at a frequency quicker than the time required for clock switchover circuit 130 to complete a switchover between the clocks may result in a glitch in output clock 140.

First clock 110 may communicate first clock signal 112 to clock switchover circuit 130 and glitch reduction circuit 150. First clock signal 112 represents a clocking signal communicated from first clock 110. First clock 110 may also communicate first clock stopped signal 114 to clock switchover circuit 130 and glitch reduction circuit 150. First clock stopped signal 114 may indicate whether first clock 110 is active and/or communicating first clock signal 112 to clock switchover circuit 130 or glitch reduction circuit 150. In certain embodiments, first clock stopped signal 114 may be automatically deduced by first clock 110 and/or a component separate from first clock 110.

Moreover, similar to first clock 110, second clock 120 may communicate second clock signal 122 to clock switchover circuit 130 and glitch reduction circuit 150. Second clock signal 122 represents a clocking signal communicated from second clock 120. Second clock 120 may also communicate second clock stopped signal 124 to clock switchover circuit 130 and glitch reduction circuit 150. Second clock stopped signal 124 may indicate whether second clock 120 is active and/or communicating second clock signal 122 to clock switchover circuit 130 or glitch reduction circuit 150. In certain embodiments, second clock stopped signal 124 may be automatically determined by second clock 120 and/or a component separate from second clock 120.

Disable first clock signal 132 is communicated from clock switchover circuit 130 to glitch reduction circuit 150. Disable first clock signal 132 is a signal which indicates that the first clock signal 112 should be gated for output clock 140 and is based on combinational logic and/or flip-flops in clock switchover circuit 130. Similarly, disable second clock signal 134 is communicated from clock switchover circuit 130 to glitch reduction circuit 150. Disable second clock signal 134 is a signal which indicates that the second clock signal 122 should be gated for output clock 140 and is based on combinational logic and/or flip-flops in clock switchover circuit 130. The combinational logic and flip-flops that result in disable first clock signal 132 and disable second clock signal 134 are illustrated in further detail in FIG. 2.

Figure 2:
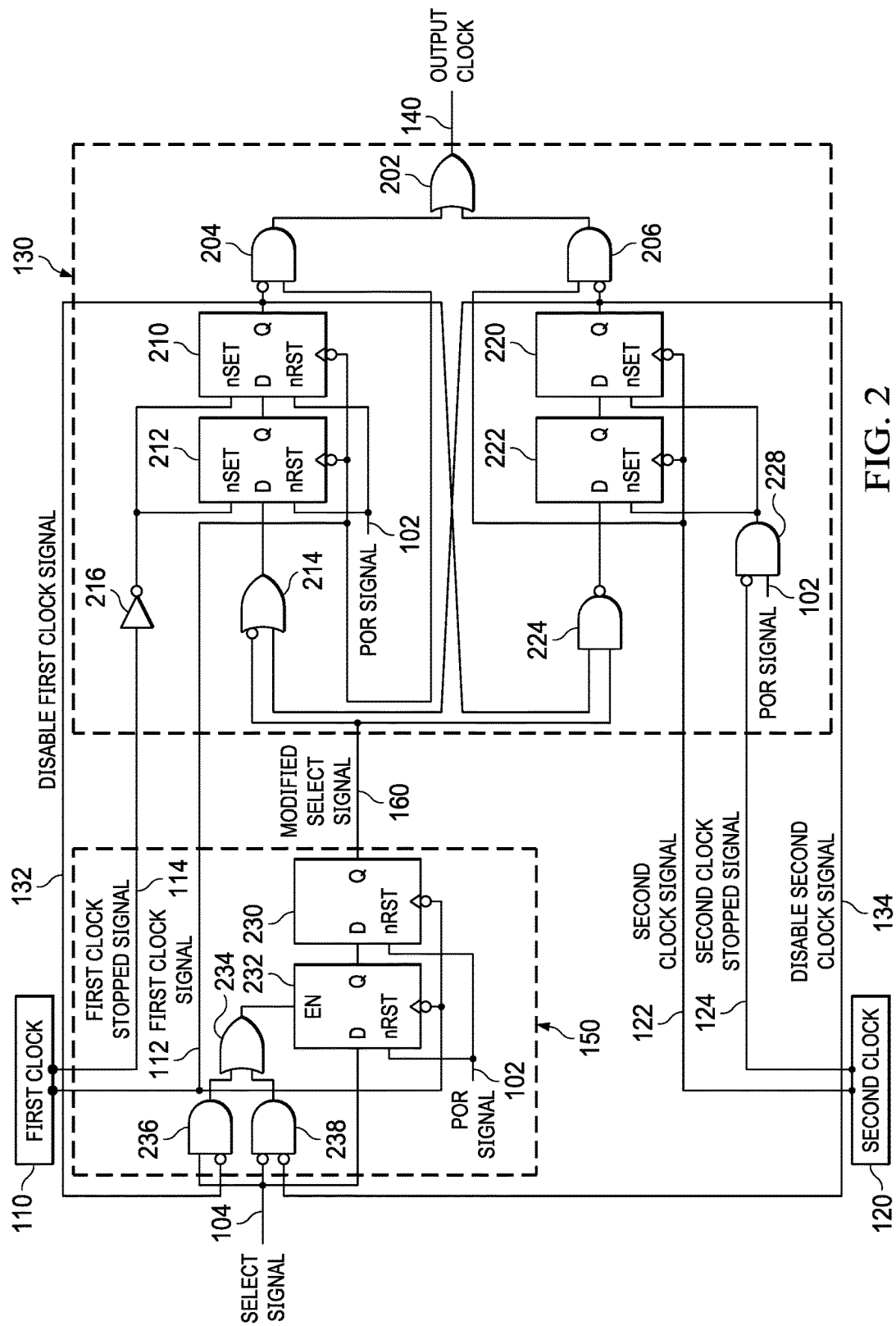
FIG. 2 illustrates a first exemplary embodiment of a glitch reduction circuit and a clock switchover circuit.

FIG. 2 illustrates a first exemplary embodiment of glitch reduction circuit 150 and clock switchover circuit 130. As illustrated, clock switchover circuit 130 may comprise a variety of combinational logic, latches, and/or flip-flops. Clock switchover circuit 130 may comprise first OR gate 202, first AND gate 204, second AND gate 206, first D flip-flop 210, second D flip-flop 212, second OR gate 214, inverter 216, third D flip-flop 220, fourth D flip-flop 222, first NAND gate 224, and third AND gate 228. As illustrated, glitch reduction circuit 150 may also comprise a variety of combinational logic and/or flip-flops. Glitch reduction circuit 150 may comprise fifth D flip-flop 230, sixth flip-flop 232, third OR gate 234, fourth AND gate 236, and fifth AND gate 238.

The AND gates (e.g., first AND gate 204, second AND gate 206, and third AND gate 228) and OR gates (e.g., first OR gate 202) are types of basic logic with typically two or more inputs and an output. For example, an AND gate may output TRUE (e.g., an output with high voltage) when all of the inputs are TRUE (e.g., have a high voltage). As another example, an OR gate may output TRUE (e.g., an output with high voltage) when either input is TRUE (e.g., have a high voltage). On the other hand, an AND gate may output FALSE (e.g., an output with a low voltage) when at least one of the inputs is FALSE (e.g., have a low voltage), and an OR gate may output FALSE (e.g., an output with a low voltage) when neither inputs are TRUE. Moreover, one or more inputs of the AND gates and/or OR gates may be inverted. An inverted input performs a logical negation of its input. For example, an input to an inverted input of TRUE will result in a FALSE output at that inverted input. Similarly, an inverter will also perform a logical negation of its input, such as inverting an input of FALSE to an output of TRUE. The AND gates and OR gates may be implemented using any type of device and/or circuitry. While the disclosure illustrates and discusses the AND and OR gates as a simple logic gate, the disclosure encompasses various circuit and component designs and variations of the logic gate that result in a similar logic table as the illustrated AND and OR gates.

Similarly, the NAND gates (e.g., first NAND gate 224) and NOR gates are additional types of basic logic with typically two or more inputs and an output. For example, a NAND gate may output TRUE when either none or only one of the inputs is TRUE. As another example, a NOR gate may output TRUE only when both inputs are FALSE. On the other hand, a NAND gate may output FALSE when both of the inputs are TRUE, and a NOR gate may output FALSE when any input is TRUE. While the disclosure illustrates and discusses the NAND and NOR gates as a simple logic gate, the disclosure encompasses various circuit and component designs and variations of the logic gate that result in a similar logic table as the illustrated NAND and NOR gates.

In addition, latches (e.g., first D flip-flop 210, second D flip-flop 212, third D flip-flop 220, and fourth D flip-flop 222) may be a circuit that can be used to store information. In particular, latches can be made to change states by applying a signal to one or more control inputs. Typically, a latch stores a single bit of data. Latches, such as Set-Reset ("SR") flip-flops, Data ("D") flip-flops, Toggle ("T") flip-flops, and JK flips-flops may be used.

In particular, a D flip-flop may capture a value of the D-input typically at the rising edge of the clock ("CK") input, and the captured value becomes output Q. In addition, an nRST or nSET input is used to reset the D flip-flop to its initial state. Typically, nRST and nSET input types are active low. nRST generally initializes output Q to LOW, while nSET generally initializes output Q to HIGH. Moreover, an Enable ("EN") port enables the D flip-flop to either enable the D flip-flop when the EN port is TRUE or to disable the D flip-flop by forcing output Q of D flip-flop to LOW when the EN port is FALSE. While the disclosure implements D flip-flops in its illustration, the disclosure encompasses various latches (e.g., SR flip-flops, T flip-flops, and JK flip-flops), circuits, component designs, and variations that result in a similar output as the illustrated D flip-flop.

For the clock switchover circuit 130, the output of first OR gate 202 is output clock 140. The first input of first OR gate 202 is coupled to the output of first AND gate 204, and the second input of first OR gate 202 is coupled to the output of second AND gate 206. The first input of first AND gate 204 is an inverted input and coupled to output Q of first D flip-flop 210. In addition, the second input of first AND gate 204 receives first clock signal 112. Note that output Q of first D flip-flop 210 is also disable first clock signal 132. Disable first clock signal 132 is communicated from clock switchover circuit 130 to glitch reduction circuit 150.

First D flip-flop 210 is a D flip-flop with input D coupled to output Q of second D flip-flop 212. First D flip-flop 210 also contains an nSET port connected to inverter 216 and an nRST port that receives POR signal 102. The clocking input for first D flip-flop 210 is connected to first clock signal 112.

Second D flip-flop 212 is also a D flip-flop with input D connected to the output of second OR gate 214. Second D flip-flop 212 also contains an nSET port connected to inverter 216 and an nRST port connected to POR signal 102. The clocking input for second D flip-flop 212 is connected to first clock signal 112.

The first input of second OR gate 214 is connected to modified select signal 160 transmitted by glitch reduction circuit 150. The second input of second OR gate 214 may be an inverted input and is connected to output Q of third D flip-flop 220. Note that output Q of third D flip-flop 220 is also disable second clock signal 134. Disable second clock signal 134 is communicated from clock switchover circuit 130 to glitch reduction circuit 150.

The input of inverter 216 is first clock stopped signal 114 from first clock 110. The output of inverter 216 may be communicated to the nSET ports of first D flip-flop 210 and second D flip-flop 212.

The first input of second AND gate 206 is second clock signal 122 as transmitted by second clock 120. The second input of second AND gate 206 is an inverted input and is coupled to output Q of third D flip-flop 220. Note that output Q of third D flip-flop 220 is disable second clock signal 134.

Input D of third D flip-flop 220 is coupled to output Q of fourth D flip-flop 222, and the nSET port of third D flip-flop 220 is coupled to the output of third AND gate 228. The clock input of third D flip-flop 220 is an inverted input and coupled to second clock signal 122 from second clock 120.

Input D of fourth D flip-flop 222 is coupled to an output of first NAND gate 224, and the nSET port of fourth D flip-flop 222 is coupled to the output of third AND gate 228. The clock input of fourth D flip-flop 222 is an inverted input and is coupled to second clock signal 122 from second clock 120.

The first input of first NAND gate 224 is coupled to output Q of first D flip-flop 210. Note that output Q of first D flip-flop 210 is also disable first clock signal 132. The second input of first NAND gate 224 is coupled to modified select signal 160 transmitted by glitch reduction circuit 150.

The first input of third AND gate 228 is an inverted input and is coupled to second clock stopped signal 122 from second clock 120. The second input of third AND gate 228 is POR signal 102

For glitch reduction circuit 150, output Q of fifth D flip-flop 230 is modified select signal 160. Modified select signal 160 is transmitted from glitch reduction circuit 150 to clock switch over circuit 130. Input D of the fifth D flip-flop 230 is coupled to output Q of sixth D flip-flop 232. The nRST port of fifth D flip-flop 230 is coupled to POR signal 102, and the clock input for fifth D flip-flop 230 is an inverted input and is coupled to first clock signal 112 as transmitted by first clock 110.

Input D of sixth D flip-flop 232 is coupled to select signal 104. The EN port of sixth D flip-flop 232 is coupled to the output of third OR gate 234, and the nRST port of sixth D flip-flop 232 is coupled to POR signal 102. Clock port for sixth D flip-flop 232 is coupled to first clock signal 112 from first clock 110.

First input for third OR gate 234 is coupled to the output of fourth AND gate 236, and the second input for third OR gate 234 is coupled to the output of fifth AND gate 238. The first input of fourth AND gate 236 is coupled to select signal 104. The second input of fourth AND gate 236 may be an inverted input and may be coupled to disable first clock signal 132 from clock switch over circuit 130. The first input for fifth AND gate 238 may be an inverted input and may be coupled to select signal 104. The second input for fifth AND gate 238 may be an inverted input and may be coupled to disable second clock signal 134.

In an alternative embodiment, the first input for fourth AND gate 236 is coupled to select signal 104, the second input for fourth AND gate 236 is coupled to disable second clock signal 134, and the third input for fourth AND gate 236 is coupled to first clock signal 112. In addition, in this alternative embodiment, the first input for fifth AND gate 238 is coupled to select signal 104, the second input for fifth AND gate 238 is coupled to disable second clock signal 134, and the third input for fifth AND gate 238 is coupled to second clock signal 122.

In adding glitch reduction circuit 150 to clock switchover circuit 130, glitch reduction circuit 150 may prevent glitches that occur when select signal 104 quickly toggles between '1' and '0.' By adding glitch reduction circuit 150, output clock 140 avoids a glitch because glitch reduction circuit 150 forces modified select signal 160 to cause clock switchover circuit 130 to hold its previous latched value until the clock switchover is complete. Glitch reduction circuit 150 may also ensure synchronization of the signal driving the EN port of the flip-flop 232 (i.e., the output of third OR gate 234) into its clock domain (e.g., synchronizing the output of third OR gate 234 with first clock signal 112) to ensure no metastability is introduced due to asynchronous signals being used in a synchronous manner.

Figure 3:
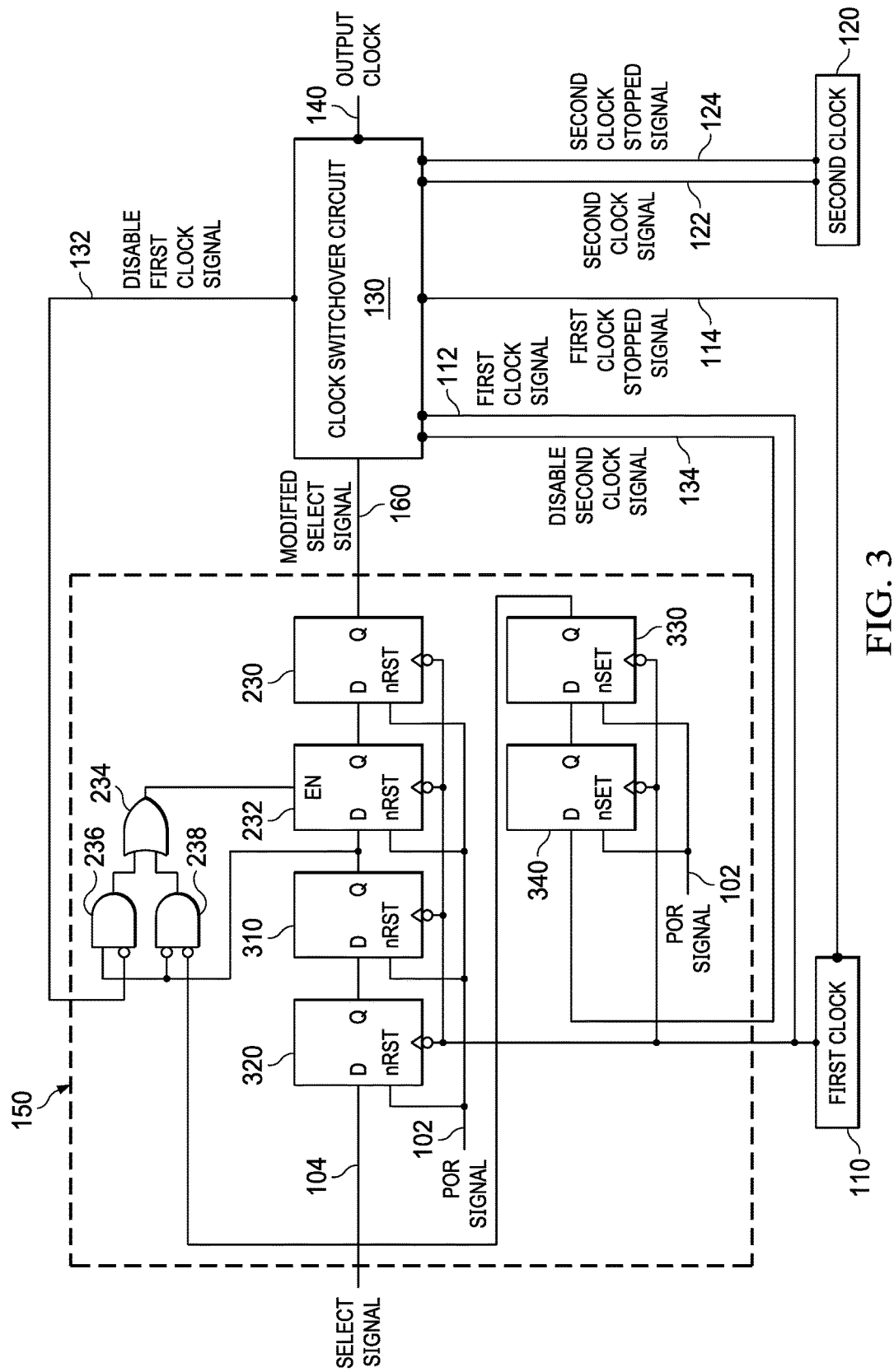
FIG. 3 illustrates a second exemplary embodiment of a glitch reduction circuit and a clock switchover circuit.

FIG. 3 illustrates a second exemplary embodiment of glitch reduction circuit 150 and clock switchover circuit 130. As illustrated, glitch reduction circuit 150 may also comprise a variety of combinational logic and/or flip-flops. Glitch reduction circuit 150 may comprise fifth D flip-flop 230, sixth D flip-flop 232, third OR gate 234, fourth AND gate 236, fifth AND gate 238, seventh D flip-flop 310, eighth D flip-flop 320, ninth D flip-flop 330, and tenth D flip-flop 340. The second exemplary embodiment of glitch reduction circuit 150 may prevent a race condition that may occur when the received select signal 104 is not synchronized to first clock signal 112. If select signal 104 is toggling close to the active edge of first clock signal 112, for example, the 'D' and 'EN' ports of sixth D flip-flop 232 may receive different statuses of select signal 104 maybe taken into account by, which is not desired. For example, second exemplary embodiment of glitch reduction circuit 150 may prevent output clock 140 from latching on to the wrong output when modified select signal 160 changes at the same time as first clock signal 112. As an additional example, second exemplary embodiment of glitch reduction circuit 150 may prevent metastability if there is no fixed phase relationship between first clock signal 112 and second clock signal 122. When there is no fixed phase relationship between first clock signal 112 and second clock signal 122, then disable second clock signal 134 may introduce metastability during its usage when synchronous to first clock signal 112. The second exemplary embodiment of glitch reduction circuit 150 may provide additional robustness by synchronizing first clock signal 112 and second clock signal 122 prior to usage, even when first clock signal 112 and second clock signal 122 do not have a frequency or phase relationship.

For glitch reduction circuit 150, output Q of fifth D flip-flop 230 is modified select signal 160. Modified select signal 160 is transmitted from glitch reduction circuit 150 to clock switch over circuit 130. Input D of fifth D flip-flop 230 is coupled to output Q of sixth D flip-flop 232. The nRST port of fifth D flip-flop 230 is coupled to POR signal 102, and the clock input for fifth D flip-flop 230 is an inverted input and is coupled to first clock signal 112 as transmitted by first clock 110.

Input D of sixth D flip-flop 232 is coupled to output Q of seventh D flip-flop 310. The EN port of sixth D flip-flop 232 is coupled to the output of third OR gate 234, and the nRST port of sixth D flip-flop 232 is coupled to POR signal 102. Clock port for sixth D flip-flop 232 is coupled to first clock signal 112 from first clock 110.

Input D of seventh D flip-flop 310 is coupled to output Q of eighth D flip-flop 320, and the nRST port of seventh D flip-flop 310 is coupled to POR signal 102. Clock port for seventh D flip-flop 310 is coupled to first clock signal 112 from first clock 110.

Moreover, input D of eighth D flip-flop 320 is coupled to select signal 104, and the nRST port of eighth D flip-flop 320 is coupled to POR signal 102. Clock port for eighth D flip-flop 320 is coupled to first clock signal 112 from first clock 110.

First input for third OR gate 234 is coupled to the output of fourth AND gate 236, and the second input for third OR gate 234 is coupled to the output of fifth AND gate 238. The first input of fourth AND gate 236 is coupled to output Q of seventh D flip-flop 310, and the second input of fourth AND gate 236 is coupled to disable first clock signal 132 from clock switchover circuit 130. In addition, the first input of fifth AND gate 238 is an inverted input, and is coupled to output Q of seventh D flip-flop 310. The second input of fifth AND gate 238 is coupled to output Q of ninth D flip-flop 330.

Input D of ninth D flip-flop 330 is coupled to output Q of tenth D flip-flop 340, and the nSET port of ninth D flip-flop 330 is coupled to POR signal 102. Clock port for ninth D flip-flop 330 is coupled to first clock signal 112 from first clock 110.

In addition, input D of tenth D flip-flop 340 is coupled to disable second clock signal 134 from clock switchover circuit 130, and the nSET port of tenth D flip-flop 340 is coupled to POR signal 102. Clock port for tenth D flip-flop 340 is coupled to first clock signal 112 from first clock 110.

Figure 4:
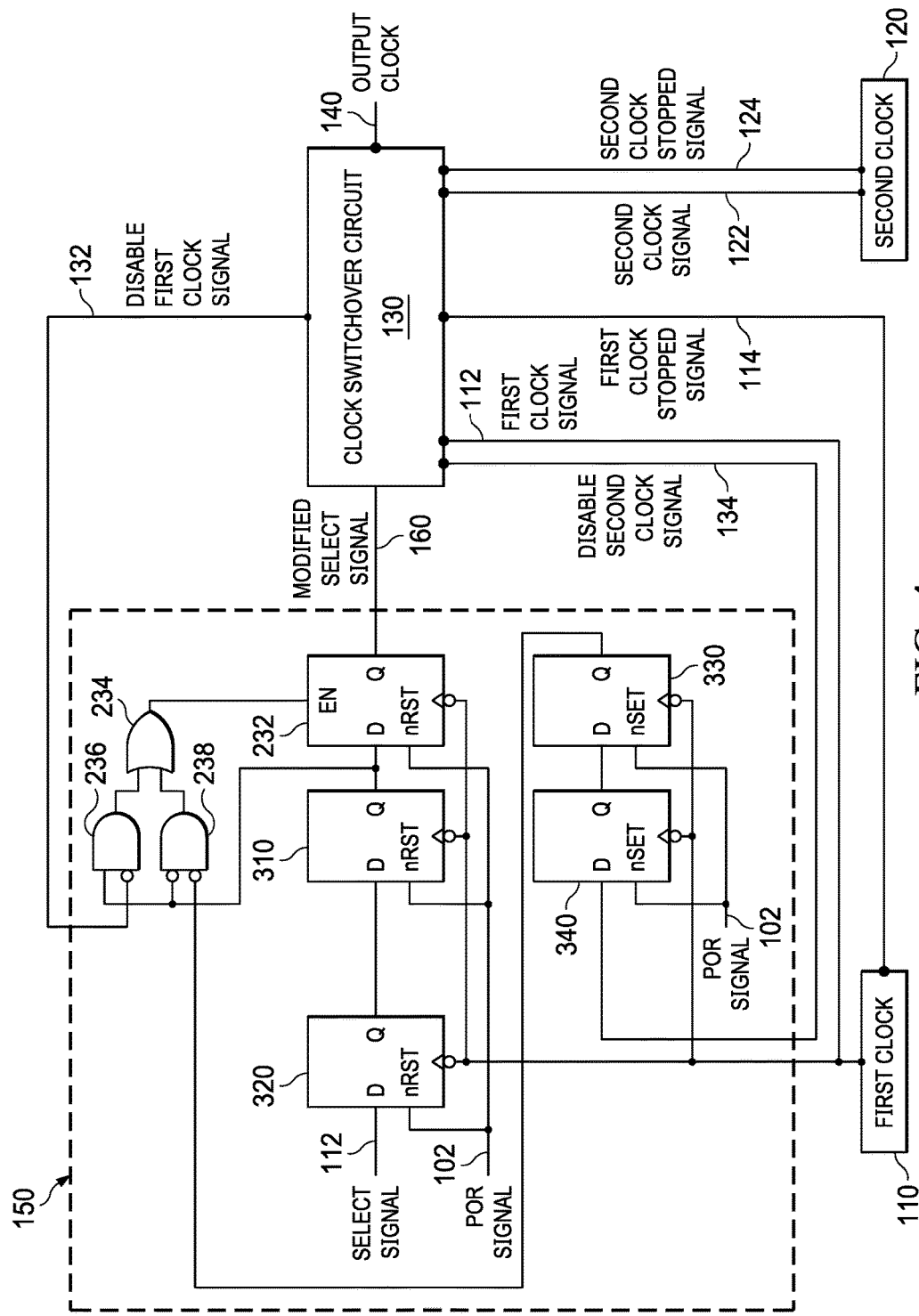
FIG. 4 illustrates a third exemplary embodiment of a glitch reduction circuit and a clock switchover circuit.

FIG. 4 illustrates a third exemplary embodiment of glitch reduction circuit 150 and clock switchover circuit 130. As illustrated, glitch reduction circuit 150 may also comprise a variety of combinational logic and/or flip-flops. Glitch reduction circuit 150 may comprise sixth D flip-flop 232, third OR gate 234, fourth AND gate 236, fifth AND gate 238, seventh D flip-flop 310, eighth D flip-flop 320, ninth D flip-flop 330, and tenth D flip-flop 340. Notably, fifth D flip-flop 230 is not present in the third exemplary embodiment of glitch reduction circuit 150.

For glitch reduction circuit 150, output Q of sixth D flip-flop 232 is modified select signal 160. Modified select signal 160 is transmitted from glitch reduction circuit 150 to clock switch over circuit 150. Input D of sixth D flip-flop 232 is coupled to output Q of seventh D flip-flop 310. The EN port of sixth D flip-flop 232 is coupled to the output of third OR gate 234, and the nRST port of sixth D flip-flop 232 is coupled to POR signal 102. Clock port for sixth D flip-flop 232 is coupled to first clock signal 112 from first clock 110.

Input D of seventh D flip-flop 310 is coupled to output Q of eighth D flip-flop 320, and the nRST port of seventh D flip-flop 310 is coupled to POR signal 102. Clock port for seventh D flip-flop 310 is coupled to first clock signal 112 from first clock 110.

Moreover, input D of eighth D flip-flop 320 is coupled to select signal 104, and the nRST port of eighth D flip-flop 320 is coupled to POR signal 102. Clock port for eighth D flip-flop 320 is coupled to first clock signal 112 from first clock 110.

First input for third OR gate 234 is coupled to the output of fourth AND gate 236, and the second input for third OR gate 234 is coupled to the output of fifth AND gate 238. The first input of fourth AND gate 236 is coupled to output Q of seventh D flip-flop 310. The second input of fourth AND gate 236 is an inverted input and is coupled to disable first clock signal 132 from clock switchover circuit 130. In addition, the first input of fifth AND gate 238 is an inverted input, and is coupled to output Q of seventh D flip-flop 310. The second input of fifth AND gate 238 is also an inverted input, and is coupled to output Q of ninth D flip-flop 330.

Input D of ninth D flip-flop 330 is coupled to output Q of tenth D flip-flop 340, and the nSET port of ninth D flip-flop 330 is coupled to POR signal 102. Clock port for ninth D flip-flop 330 is coupled to first clock signal 112 from first clock 110.

In addition, input D of tenth D flip-flop 340 is coupled to disable second clock signal 134 from clock switchover circuit 130, and the nSET port of tenth D flip-flop 340 is coupled to POR signal 102. Clock port for tenth D flip-flop 340 is coupled to first clock signal 112 from first clock 110.

Figure 5:
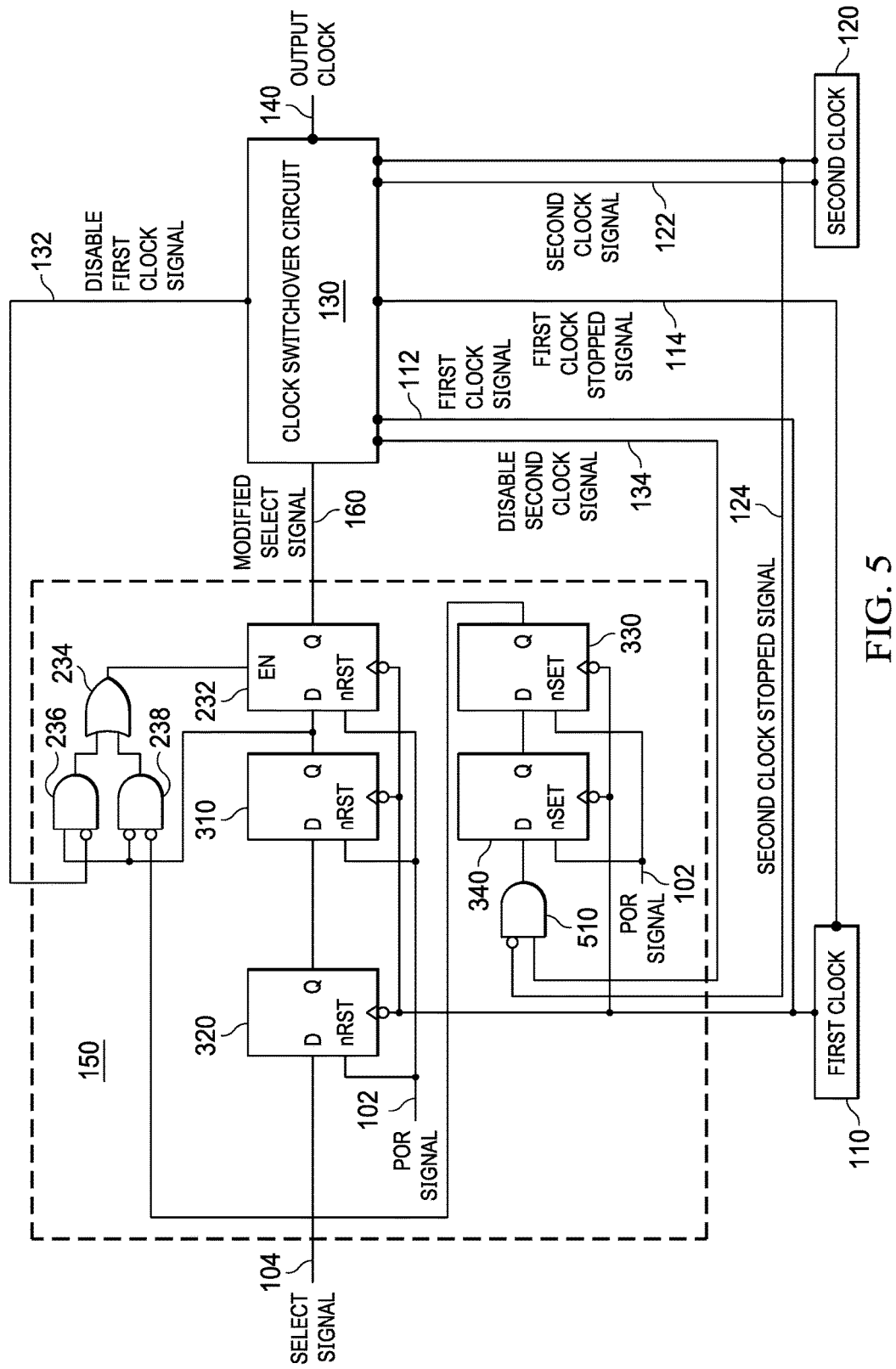
FIG. 5 illustrates a fourth exemplary embodiment of a glitch reduction circuit and a clock switchover circuit.

FIG. 5 illustrates a fourth exemplary embodiment of glitch reduction circuit 150 and clock switchover circuit 130. As illustrated, glitch reduction circuit 150 may also comprise a variety of combinational logic and/or flip-flops. Glitch reduction circuit 150 may comprise sixth D flip-flop 232, third OR gate 234, fourth AND gate 236, fifth AND gate 238, seventh D flip-flop 310, eighth D flip-flop 320, ninth D flip-flop 330, tenth D flip-flop 340, and sixth AND gate 510. The fourth exemplary embodiment of glitch reduction circuit 150 may prevent a condition that may occur when second clock 120 has stopped, output Q of ninth D flip-flop 330 is high, disable first clock signal 132 is high, and disable second clock signal 134 is high. For example, the fourth exemplary embodiment of glitch reduction circuit 150 may transition to first clock 110 when second clock 120 has stopped, output Q of ninth D flip-flop 330 is high, disable first clock signal 132 is high, and disable second clock signal 134 is high. Without the addition of sixth AND gate 510 that assists in timely switching from second clock signal 122 to first clock signal 112 or from first clock signal 112 to second clock signal 122, this scenario may result in a deadlock situation.

For glitch reduction circuit 150, output Q of sixth D flip-flop 232 is modified select signal 160. Modified select signal 160 is transmitted from glitch reduction circuit 150 to clock switch over circuit 150. Input D of sixth D flip-flop 232 is coupled to output Q of seventh D flip-flop 310. The EN port of sixth D flip-flop 232 is coupled to the output of third OR gate 234, and the nRST port of sixth D flip-flop 232 is coupled to POR signal 102. Clock port for sixth D flip-flop 232 is coupled to first clock signal 112 from first clock 110.

Input D of seventh D flip-flop 310 is coupled to output Q of eighth D flip-flop 320, and the nRST port of seventh D flip-flop 310 is coupled to POR signal 102. Clock port for seventh D flip-flop 310 is coupled to first clock signal 112 from first clock 110.

Moreover, input D of eighth D flip-flop 320 is coupled to select signal 104, and the nRST port of eighth D flip-flop 320 is coupled to POR signal 102. Clock port for eighth D flip-flop 320 is coupled to first clock signal 112 from first clock 110.

First input for third OR gate 234 is coupled to the output of fourth AND gate 236, and the second input for third OR gate 234 is coupled to the output of fifth AND gate 238. The first input of fourth AND gate 236 is coupled to output Q of seventh D flip-flop 310, and the second input of fourth AND gate 236 is an inverted input and is coupled to disable first clock signal 132 from clock switchover circuit 130. In addition, the first input of fifth AND gate 238 is an inverted input, and is coupled to output Q of seventh D flip-flop 310. The second input of fifth AND gate 238 is also an inverted input and is coupled to output Q of ninth D flip-flop 330.

Input D of ninth D flip-flop 330 is coupled to output Q of tenth D flip-flop 340, and the nSET port of ninth D flip-flop 330 is coupled to POR signal 102. Clock port for ninth D flip-flop 330 is coupled to first clock signal 112 from first clock 110. The nSET port of tenth D flip-flop 340 is coupled to POR signal 102. Clock port for tenth D flip-flop 340 is coupled to first clock signal 112 from first clock 110.

In addition, input D of tenth D flip-flop 340 is coupled to the output of sixth AND gate 510. The first input of sixth AND gate 510 may be an inverted input, and may be coupled to second clock stopped signal 124. The second input of sixth AND gate 510 may be coupled to disable second clock signal 134 from clock switchover circuit 130.

Figure 6:
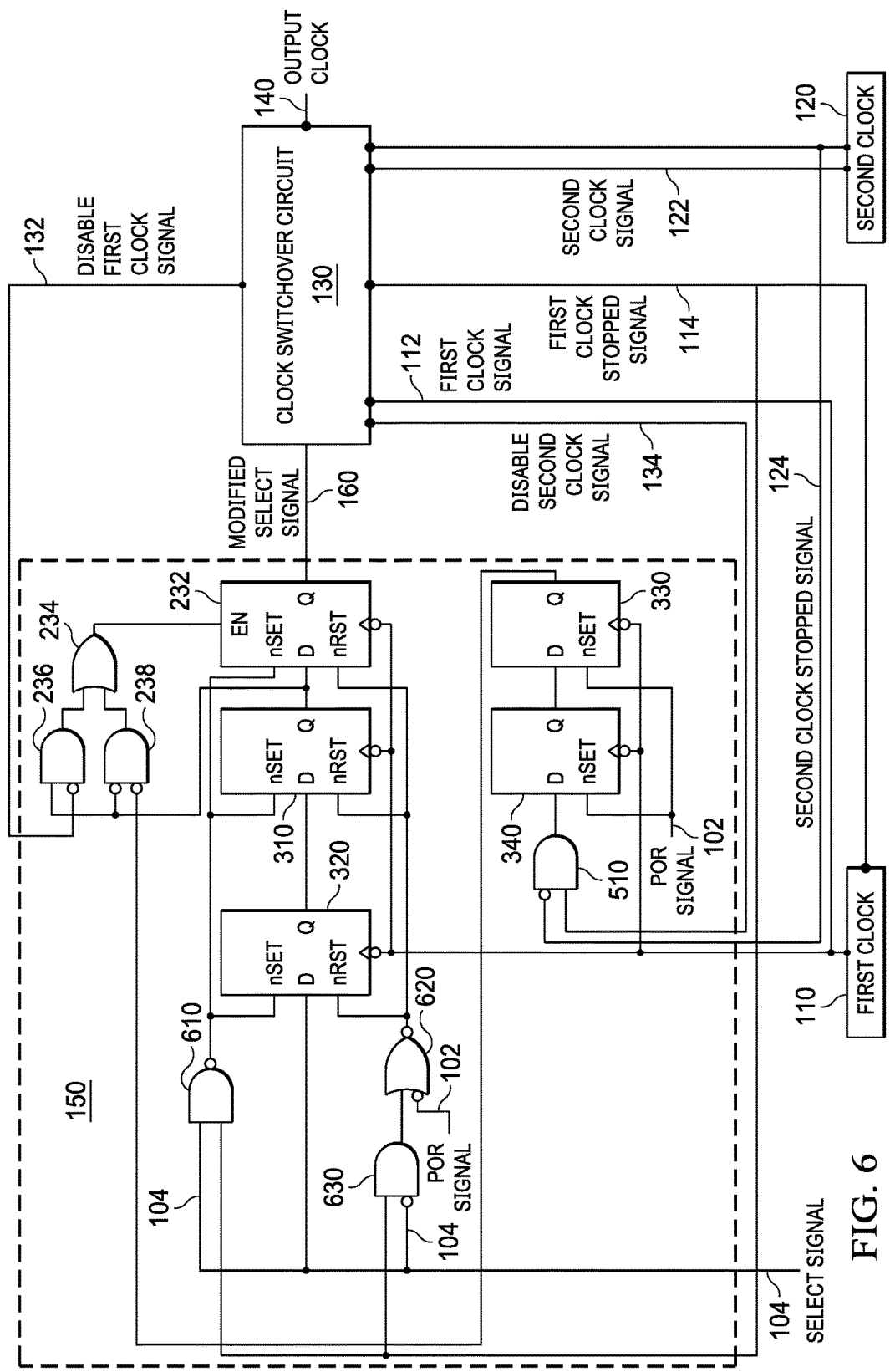
FIG. 6 illustrates a fifth exemplary embodiment of a glitch reduction circuit and a clock switchover circuit.

FIG. 6 illustrates a fifth exemplary embodiment of glitch reduction circuit 150 and clock switchover circuit 130. As illustrated, glitch reduction circuit 150 may also comprise a variety of combinational logic and/or flip-flops. Glitch reduction circuit 150 may comprise sixth D flip-flop 232, third OR gate 234, fourth AND gate 236, fifth AND gate 238, seventh D flip-flop 310, eighth D flip-flop 320, ninth D flip-flop 330, tenth D flip-flop 340, sixth AND gate 510, second NAND gate 610, NOR gate 620, and seventh AND gate 630. The fifth exemplary embodiment of glitch reduction circuit 150 may prevent a deadlock condition by adding asynchronous logic to allow modified select signal 160 to asynchronously set or reset to the same value as select signal 104. For example, in a scenario where first clock signal 112 is stuck, second NAND gate 610, NOR gate 620, and seventh AND gate 630 assert asynchronous inputs to sixth D flip-flop 232, seventh D flip-flop 310, and eighth D flip-flop 320 without relying on first clock signal 112.

Accordingly, the fifth exemplary embodiment of glitch reduction circuit 150 helps ensure that the commanded value of the select signal 104 is propagated through to the output of the sixth D flip-flop 232, seventh D flip-flop 310, and eighth D flip-flop 320 even when first clock signal 112 is stuck.

For glitch reduction circuit 150, output Q of sixth D flip-flop 232 is modified select signal 160. Modified select signal 160 transmitted from glitch reduction circuit 150 to clock switch over circuit 150. Input D of sixth D flip-flop 232 is coupled to output Q of seventh D flip-flop 310. The EN port of sixth D flip-flop 232 is coupled to the output of third OR gate 234, and the nRST port of sixth D flip-flop 232 is coupled to the output of NOR gate 620. Clock port for sixth D flip-flop 232 is coupled to first clock signal 112 from first clock 110. In addition, nSET port for sixth D flip-flop 232 is coupled to the output of second NAND gate 610.

Input D of seventh D flip-flop 310 is coupled to output Q of eighth D flip-flop 320, and the nRST port of seventh D flip-flop 310 is coupled to the output of NOR gate 620. Clock port for seventh D flip-flop 310 is coupled to first clock signal 112 from first clock 110. In addition, nSET port for seventh D flip-flop 310 is coupled to the output of second NAND gate 610.

Moreover, input D of eighth D flip-flop 320 is coupled to select signal 104, and the nRST port of eighth D flip-flop 320 is coupled to the output of NOR gate 620. Clock port for eighth D flip-flop 320 is coupled to first clock signal 112 from first clock 110. In addition, nSET port for eighth D flip-flop 320 is coupled to the output of second NAND gate 610.

First input for third OR gate 234 is coupled to the output of fourth AND gate 236, and the second input for third OR gate 234 is coupled to the output of fifth AND gate 238. The first input of fourth AND gate 236 is coupled to output Q of seventh D flip-flop 310, and the second input of fourth AND gate 236 is an inverted input and is coupled to disable first clock signal 132 from clock switchover circuit 130. In addition, the first input of fifth AND gate 238 is an inverted input, and is coupled to output Q of seventh D flip-flop 310. The second input of fifth AND gate 238 is also an inverted input and is coupled to output Q of ninth D flip-flop 330.

Input D of ninth D flip-flop 330 is coupled to output Q of tenth D flip-flop 340, and the nSET port of ninth D flip-flop 330 is coupled to POR signal 102. Clock port for ninth D flip-flop 330 is coupled to first clock signal 112 from first clock 110. The nSET port of tenth D flip-flop 340 is coupled to POR signal 102. Clock port for tenth D flip-flop 340 is coupled to first clock signal 112 from first clock 110.

In addition, input D of tenth D flip-flop 340 is coupled to the output of sixth AND gate 510. The first input of sixth AND gate 510 may be an inverted input, and may be coupled to second clock stopped signal 124. The second input of sixth AND gate 510 may be coupled to disable second clock signal 134 from clock switchover circuit 130.

The first input of second NAND gate 610 is select signal 104, and the second input of second NAND gate 610 is first clock stopped signal 114. In addition, the first input of NOR gate 620 is the output of seventh AND gate 630. The second input of NOR gate 620 is an inverted input and receives POR signal 102. Finally, the first input of seventh AND gate 630 is first clock stopped signal 114. In addition, the second input of seventh AND gate 630 is an inverted input, and is coupled to select signal 104.

Figure 7:
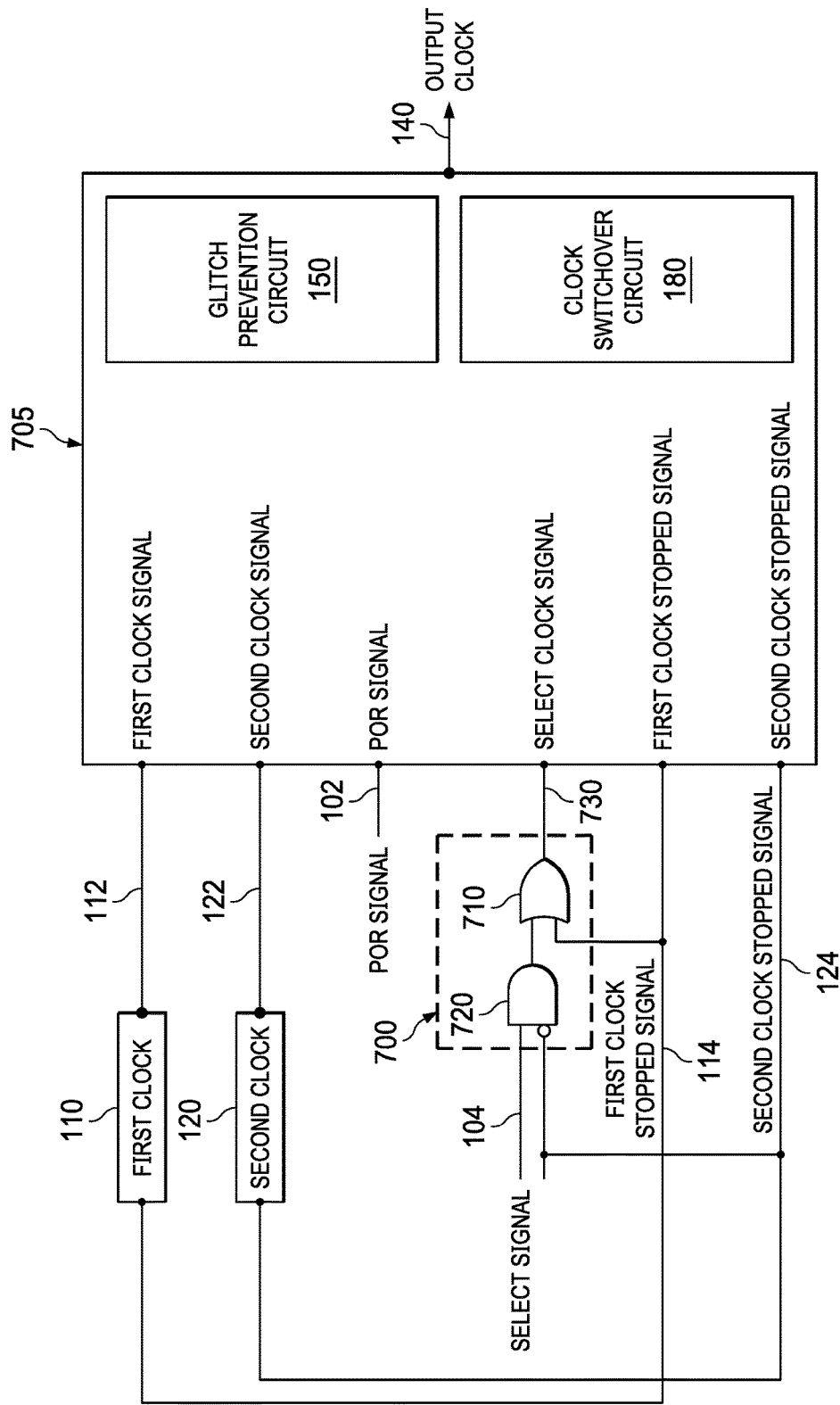
FIG. 7 illustrates an automatic switchover circuit that automatically switches between clocks during exceptional circumstances.

FIG. 7 illustrates automatic switchover circuit 700 that automatically switches between clocks during exceptional circumstances. Automatic switchover circuit 700 comprises fourth OR gate 710 and eighth AND gate 720. In certain embodiments, automatic switchover circuit 700 forces a transition to first clock 110 when second clock 120 has stopped or becomes unreliable. Similarly, automatic switchover circuit 700 forces a transition to second clock 120 when first clock 110 has stopped or becomes unreliable. Forcing a transition to second clock 120 when first clock 110 has stopped or becomes unreliable is particularly useful in applications such as safety critical automotive systems, which require continuous operation even under fault scenarios (e.g., clock stoppage). In these fault scenarios, the system may be placed in a safe state and a master device may be alerted.

Automatic switchover circuit 700 may interact with clock switchover component 705. Clock switchover component 705 may comprise glitch reduction circuit 150 and clock switchover circuit 130. Clock switchover component 705 may have multiple input ports. For example, clock switchover component 705 may have a first input port for first clock signal 112 from first clock 110, a second input port for second clock signal 122 from second clock 120, a third input port for POR signal 102, a fourth input port for first clock stopped signal 114 from first clock 110, and a fifth input port for second clock stopped signal 124 from second clock 120. Automatic-switchover signal 730 may be communicated from automatic switchover circuit 700.

In automatic switchover circuit 700, the output of fourth OR gate 710 is automatic-switchover signal 730, and is coupled to clock switchover component 705. Automatic-switchover signal 730 prevents a glitch from occurring when either first clock 110 or second clock 120 becomes dead or unreliable.

The first input of fourth OR gate 710 is coupled to the output of eighth AND gate 720, and the second input of fourth OR gate 710 is coupled to first clock stopped signal 114. In addition, the first input of third OR gate 720 is select signal 104. The second input of third OR gate 720 is an inverted input, and is coupled to second clock stopped signal 124.

Figure 8:
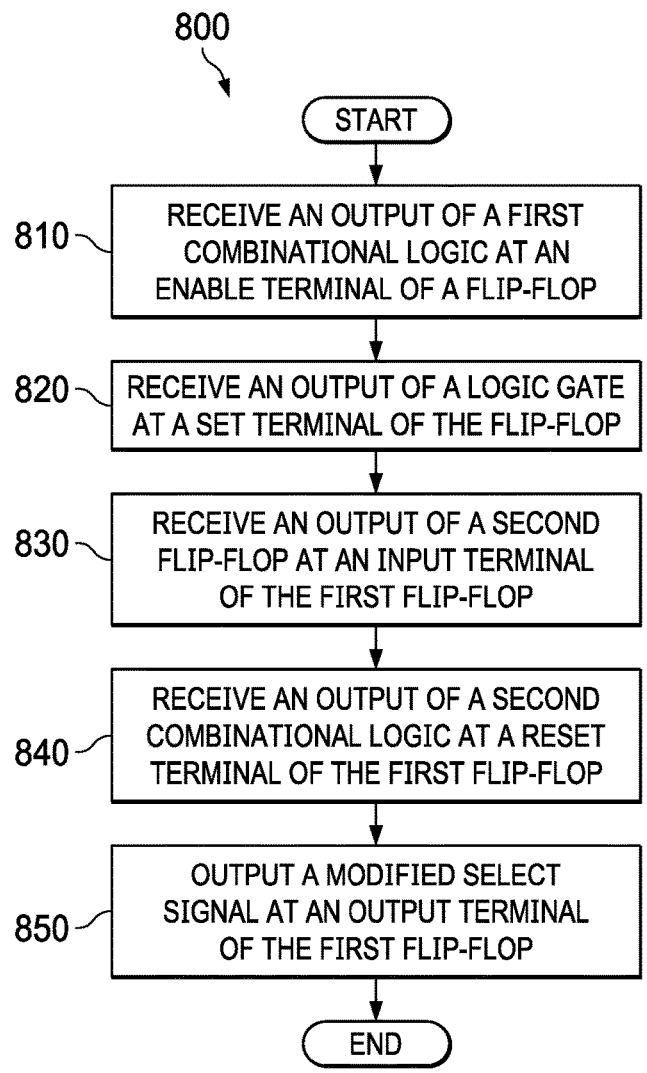
FIG. 8 illustrates an example method for reducing glitches on an output clock when transferring clock signals between a first clock and a second clock.

FIG. 8 illustrates an example method 800 for reducing glitches on an output clock when transferring clock signals between a first clock and a second clock.

The method may begin at step 810, where an enable terminal of sixth flip-flop 232 receives an output of a first combinational logic. The first combinational logic may comprise third OR gate 234, fourth AND gate 236, and fifth AND gate 238. The first input for third OR gate 234 may be coupled to the output of fourth AND gate 236, and the second input for third OR gate 234 may be coupled to the output of fifth AND gate 238. The first input of fourth AND gate 236 may be coupled to select signal 104. The second input of fourth AND gate 236 may be an inverted input and may be coupled to disable first clock signal 132 from clock switch over circuit 130. The first input for fifth AND gate 238 may be an inverted input and may be coupled to select signal 104. The second input for fifth AND gate 238 may be an inverted input and may be coupled to disable second clock signal 134.

At step 820, the set terminal of sixth D flip-flop 232 (i.e., nSET terminal) receives an output of second NAND gate 610. Second NAND gate 610 may receive select signal 104 and first clock stopped signal 114.

At step 830, the input terminal of sixth D flip-flop 232 (i.e., D terminal) receives an output of seventh D flip-flop 310 (i.e., output Q). The input of seventh D flip-flop 310 (i.e., input D) maybe coupled to the output of eighth D flip-flop 320 (i.e., output Q), and the input of eighth D flip-flop 320 may receive select signal 104. In certain embodiments, a clock input of sixth D flip-flop 232, seventh D flip-flop 310, and/or eighth D flip-flop 320 may receive a clock signal, such as first clock signal 112. In addition, the clock input of sixth D flip-flop 232, seventh D flip-flop 310, and/or eighth D flip-flop 320 may be an inverted input.

At step 840, the reset terminal of sixth D flip-flop 232 (i.e., nRST terminal) receives an output of a second combinational logic. The second combinational logic may have one or more inputs comprising first clock stopped signal 114, POR signal 102, select signal 104, and first clock stopped signal 114. Second combinational logic may comprise NOR gate 620 and seventh AND gate 30. The first input of NOR gate 620 may be coupled to the output of seventh AND gate 630, and the second input of NOR gate 620 may receive POR signal 102. Finally, the first input of seventh AND gate 630 may receive first clock stopped signal 114. In addition, the second input of seventh AND gate 630 may be an inverted input, and may be coupled to select signal 104.

At step 850, the output terminal of sixth D flip-flop 232 (i.e., output Q) may output modified select signal 160.

Particular embodiments may repeat one or more steps of the method of FIG. 8, where appropriate. Although this disclosure describes and illustrates particular steps of the method of FIG. 8 as occurring in a particular order, this disclosure contemplates any suitable steps of the method of FIG. 8 occurring in any suitable order. Moreover, although this disclosure describes and illustrates an example method for reducing glitches on an output clock including the particular steps of the method of FIG. 8, this disclosure contemplates any suitable method for reducing glitches on an output clock when transferring clock signals between a first clock and a second clock including any suitable steps, which may include all, some, or none of the steps of the method of FIG. 8, where appropriate. Furthermore, although this disclosure describes and illustrates particular components, devices, or systems carrying out particular steps of the method of FIG. 8, this disclosure contemplates any suitable combination of any suitable components, devices, or systems carrying out any suitable steps of the method of FIG. 8.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. An apparatus comprising,
   a flip-flop having an enable terminal, an input terminal, a set terminal, a reset terminal, and an output terminal;
   a logic gate;
   a first clock stopped signal lead;
   a disable first clock signal lead;
   a disable second clock signal lead;
   a power-on-reset signal lead;
   the enable terminal of the flip-flop coupled to the disable first clock signal lead and the disable second clock signal lead;
   the input terminal of the flip-flop adapted to be coupled to a select signal lead;
   the set terminal of the flip-flop coupled to the logic gate; and
   the reset terminal of the flip-flop coupled to the power-on-reset signal lead and the first clock stopped signal lead.

2. The apparatus of claim 1, wherein the flip-flop is a D flip-flop.

3. The apparatus of claim 1, wherein the enable terminal of the flip-flop is coupled to an OR gate, wherein:
   a first input of the OR gate is coupled to the disable first clock signal lead; and
   a second input of the OR gate is coupled to the disable second clock signal lead.

4. The apparatus of claim 3, further comprising a second flip-flop having an output, and wherein:
   the flip-flop is a first flip-flop; and
   the OR gate is further coupled to the output of the second flip-flop.

5. The apparatus of claim 1, wherein:
   the logic gate is a NAND gate;
   a first input of the NAND gate is adapted to be coupled to the select signal lead; and
   a second input of the NAND gate is coupled to the first clock stopped signal lead.

6. The apparatus of claim 1, wherein the reset terminal is coupled to a NOR gate, wherein:
   the first input of the NOR gate is coupled to the first clock stopped signal lead; and
   the second input of the NOR gate is coupled to the power-on-reset signal lead.

7. The apparatus of claim 1, further comprising a second flip-flop having an input and an output, and wherein:
   the flip-flop comprises a first flip-flop; and the input terminal of the first flip-flop is coupled to the output of the second flip-flop, wherein the input of the second flip-flop is adapted to be coupled to the select signal lead.

8. The apparatus of claim 7, further comprising a third flip-flop having an input and an output wherein:
the input of the second flip-flop is coupled to the output of the third flip-flop; and
wherein the input of the third flip-flop is adapted to be coupled to the select signal lead.

9. The apparatus of claim 1, wherein:
the flip-flop further comprises a clock input; and
the clock input of the flip-flop is coupled to a clock signal lead.

10. A method comprising:
receiving, at an enable terminal of a first flip-flop, an output of a first combinational logic, wherein one or more inputs of the first combinational logic comprises a disable first clock signal from a clock switchover circuit and a disable second clock signal from the clock switchover circuit;
receiving, at a set terminal of the first flip-flop, an output of a logic gate, wherein the logic gate receives a select signal and a first clock stopped signal, the first clock stopped signal indicating a stop in the first clock signal;
receiving, at an input terminal of the first flip-flop, an output of a second flip-flop;
receiving, at a reset terminal of the first flip-flop, an output of a second combinational logic, wherein one or more inputs of the second combinational logic comprise the first clock stopped signal, a power-on-reset signal, and the select signal; and
outputting, at an output terminal of the first flip-flop, a modified select signal.

11. The method of claim 10, wherein the first flip-flop comprises a first D flip-flop and the second flip-flop comprises a second D flip-flop.

12. The method of claim 10, further wherein the logic gate is a NAND gate.

13. The method of claim 10, wherein the logic gate is a NAND gate.

14. The method of claim 10, further comprising receiving, at an input terminal of the second flip-flop, an output of a third flip-flop.

15. The method of claim 14, further comprising receiving, at a data input of the third flip-flop, the select signal.

16. The method of claim 10, further comprising receiving, at a clock input of the first flip-flop, a clock signal.

* * * * *